(12) United States Patent
Kato et al.

(10) Patent No.: US 8,546,167 B2
(45) Date of Patent: Oct. 1, 2013

(54) GALLIUM NITRIDE-BASED COMPOUND SEMICONDUCTOR LIGHT-EMITTING ELEMENT

(75) Inventors: Ryou Kato, Osaka (JP); Shunji Yoshida, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/405,725

(22) Filed: Feb. 27, 2012

(65) Prior Publication Data

US 2012/0153258 A1 Jun. 21, 2012

Related U.S. Application Data

(63) Continuation of application No. PCT/JP2010/004433, filed on Jul. 7, 2010.

(30) Foreign Application Priority Data

Nov. 12, 2009 (JP) .................................. 2009-259162

(51) Int. Cl.
*H01L 21/00* (2006.01)

(52) U.S. Cl.
USPC ................. 438/47; 438/94; 117/86; 117/952; 372/44.011; 257/E21.297; 257/E33.013

(58) Field of Classification Search
USPC .................. 438/22, 46, 47, 93, 94; 117/85, 117/86, 952; 372/44.011; 257/98, E21.297, 257/E21.351, E33.002, E33.013
See application file for complete search history.

(56) References Cited

U.S. PATENT DOCUMENTS

| | | | |
|---|---|---|---|
| 5,693,963 A | 12/1997 | Fujimoto et al. | |
| 6,486,491 B1 | 11/2002 | Najda | |
| 2004/0238832 A1* | 12/2004 | Takahashi et al. | 257/86 |
| 2005/0040413 A1 | 2/2005 | Takahashi et al. | |

(Continued)

FOREIGN PATENT DOCUMENTS

| | | |
|---|---|---|
| JP | 2001-085797 A | 3/2001 |
| JP | 2002-016284 A | 1/2002 |

(Continued)

OTHER PUBLICATIONS

Kim et al. "study of nonpolar m-plane InGaN/GaN multiquantum well light emitting diodes grown by homoepitaxial metal-organic chemical vapor deposition", Nov. 2007, applied physics letters 91,181120.*

(Continued)

*Primary Examiner* — William D Coleman
*Assistant Examiner* — Su Kim
(74) *Attorney, Agent, or Firm* — Renner, Otto, Boisselle & Sklar, LLP

(57) ABSTRACT

A nitride-based semiconductor light-emitting element includes an n-GaN layer 102, a p-GaN layer 107, and a GaN/InGaN multi-quantum well active layer 105, which is interposed between the n- and p-GaN layers 102 and 107. The GaN/InGaN multi-quantum well active layer 105 is an m-plane semiconductor layer, which includes an $In_xGa_{1-x}N$ (where $0<x<1$) well layer 104 that has a thickness of 6 nm or more and 17 nm or less, and oxygen atoms included in the GaN/InGaN multi-quantum well active layer 105 have a concentration of $3.0\times10^{17}$ $cm^{-3}$ or less.

5 Claims, 8 Drawing Sheets

(56) References Cited

U.S. PATENT DOCUMENTS

| | | | |
|---|---|---|---|
| 2008/0179607 A1 | 7/2008 | DenBaars et al. | |
| 2008/0284865 A1 | 11/2008 | Kim | |
| 2010/0032644 A1* | 2/2010 | Akita et al. | 257/13 |
| 2010/0230690 A1 | 9/2010 | Kyono et al. | |

FOREIGN PATENT DOCUMENTS

| | | |
|---|---|---|
| JP | 2003-092456 A | 3/2003 |
| JP | 2004-072070 A | 3/2004 |
| JP | 2008-034889 A | 2/2008 |
| JP | 2009-043970 A | 2/2009 |
| WO | 2005/122267 A2 | 12/2005 |
| WO | 2008/073385 A1 | 6/2008 |
| WO | 2008/126695 A1 | 10/2008 |
| WO | WO2008/126695 * | 10/2008 |

OTHER PUBLICATIONS

Supplementary European Search Report for corresponding European Application No. 10 82 9650 issued Feb. 1, 2013.

Onuma et al., "Quantum-confined Stark effects in the m-plane $In_{0.15}Ga_{0.85}N/GaN$ multiple quantum well blue light-emitting diode fabricated on low defect density freestanding GaN substrate", Applied Physics Letters, American Institute of Physics, Melville, NY, US, vol. 91, No. 18, Oct. 29, 2007, pp. 181903-181903, XP012099932.

English translation of Notice of Reasons for Rejection issued on Jun. 16, 2011 for Japanese Patent Application No. 2011-513563 (Japanese national phase application of PCT/JP2010/004433).

English translation of Decision of Refusal issued on Aug. 26, 2011 for Japanese Patent Application No. 2011-513563 (Japanese national phase application of PCT/JP2010/004433).

International Search Report for corresponding International Application No. PCT/JP2010/004433 mailed Aug. 3, 2010.

International Preliminary Report on Patentability for corresponding International Application No. PCT/JP2010/004433 mailed Jan. 11, 2011.

Kim et al., "Study of nonpolar $m$-plane InGaN/GaN multiquantum well light emitting diodes grown by homoepitaxial metal-organic chemical vapor deposition", Applied Physics Letters, Oct. 29, 2007, vol. 91, p. 181120-1-181120-3.

Notice of Reasons for Rejection issued on Jun. 6, 2011 for Japanese Patent Application No. 2011-513563 (Japanese national phase application of PCT/JP2010/004433).

Decision of Refusal issued on Aug. 26, 2011 for Japanese Patent Application No. 2011-513563 (Japanese national phase application of PCT/JP2010/004433).

* cited by examiner

○ N
● Ga

GALLIUM NITRIDE-BASED COMPOUND SEMICONDUCTOR LIGHT-EMITTING ELEMENT

This is a continuation of International Application No. PCT/JP2010/004433, with an international filing date of Jul. 7, 2010, which claims priority of Japanese Patent Application No. 2009-259162 filed on Nov. 12, 2009, the contents of which are hereby incorporated by reference.

DESCRIPTION

Technical Field

The present disclosure relates to a gallium nitride-based compound semiconductor light-emitting element.

BACKGROUND ART

A nitride semiconductor including nitrogen (N) as a Group V element is a prime candidate for a material to make a short-wave light-emitting element because its bandgap is sufficiently wide. Among other things, gallium nitride based compound semiconductors (which will be referred to herein as "GaN-based semiconductors") have been researched and developed particularly extensively. As a result, blue-ray-emitting light-emitting diodes (LEDs), green-ray-emitting LEDs and semiconductor laser diodes made of GaN-based semiconductors have already been used in actual products.

A gallium nitride-based semiconductor has a wurtzite crystal structure. FIG. 1 schematically illustrates a unit cell of GaN. In an $Al_a Ga_b In_c N$ (where $0 \leq a, b, c \leq 1$ and $a+b+c=1$) semiconductor crystal, some of the Ga atoms shown in FIG. 1 may be replaced with Al and/or In atoms.

FIG. 2 shows four primitive vectors $a_1$, $a_2$, $a_3$ and c, which are generally used to represent planes of a wurtzite crystal structure with four indices (i.e., hexagonal indices). The primitive vector c runs in the [0001] direction, which is called a "c axis". A plane that intersects with the c axis at right angles is called either a "c plane" or a "(0001) plane". It should be noted that the "c axis" and the "c plane" are sometimes referred to as "C axis" and "C plane".

As shown in FIG. 3, the wurtzite crystal structure has other representative crystallographic plane orientations, not just the c plane. Portions (a), (b), (c) and (d) of FIG. 3 illustrate a (0001) plane, a (10-10) plane, a (11-20) plane, and a (10-12) plane, respectively. In this case, "−" attached on the left-hand side of a Miller-Bravais index in the parentheses means a "bar" (a negative direction index). The (0001), (10-10), (11-20) and (10-12) planes are c, m, a and r planes, respectively. The m and a planes are "non-polar planes" that are parallel to the c axis but the r plane is a "semi-polar plane". It should be noted that the m plane is a generic term that collectively refers to a family of (10-10), (−1010), (1-100), (−1100), (01-10) and (0-110) planes.

Light-emitting elements that use gallium nitride based compound semiconductors have long been made by "c-plane growth" process. In this description, the "X-plane growth" means epitaxial growth that is produced perpendicularly to the X plane (where X=c, m, a or r, for example) of a hexagonal wurtzite structure. As for the X-plane growth, the X plane will be sometimes referred to herein as a "growing plane". Furthermore, a layer of semiconductor crystals that have been formed as a result of the X-plane growth will be sometimes referred to herein as an "X-plane semiconductor layer".

If a light-emitting element is fabricated as a semiconductor multilayer structure by c-plane growth process, then intense internal electric polarization will be produced perpendicularly to the c plane (i.e., in the c axis direction) because the c plane is a polar plane. Specifically, that electric polarization is produced because on the c-plane, Ga and N atoms are located at different positions with respect to the c axis. Once such electric polarization is produced in a light-emitting portion, the quantum confinement Stark effect of carriers will be generated. As a result, the probability of radiative recombination of carriers in the light-emitting portion decreases, thus decreasing the light-emitting efficiency as well.

To overcome such a problem, a lot of people have recently been making every effort to grow gallium nitride based compound semiconductors on a non-polar plane such as an m or a plane or on a semi-polar plane such as an r plane. If a non-polar plane can be selected as a growing plane, then no electric polarization will be produced in the thickness direction of the light-emitting portion (i.e., in the crystal growing direction), and therefore, no quantum confinement Stark effect will be generated, either. Thus, a light-emitting element with potentially high efficiency can be fabricated. The same can be said even if a semi-polar plane is selected as a growing plane. That is to say, the influence of the quantum confinement Stark effect can be reduced significantly in that case, too.

FIG. 4(a) schematically illustrates the crystal structure of a nitride-based semiconductor, of which the principal surface is an m plane, as viewed on a cross section thereof that intersects with the principal surface of the substrate at right angles. On the m plane, Ga atoms and nitrogen atoms are on the same atomic plane. For that reason, no electric polarization will be produced perpendicularly to the m plane. It should be noted that In and Al atoms that have been added are located at Ga sites to replace Ga atoms. Even when at least some of the Ga atoms are replaced with In and Al atoms, no electric polarization will be produced perpendicularly to the m plane, either.

The crystal structure of a nitride-based semiconductor, of which the principal surface is a c plane, as viewed on a cross section thereof that intersects with the principal surface of the substrate at right angles is illustrated schematically in FIG. 4(b) just for your reference. In this case, Ga atoms and nitrogen atoms are not present on the same atomic plane, and therefore, electric polarization will be produced perpendicularly to the c plane. A c-plane GaN-based substrate is generally used as a substrate to grow GaN based semiconductor crystals thereon. As the positions of the Ga (or In) atomic layer and nitrogen atomic layer, which are parallel to the c plane, slightly shift from each other in the c-axis direction, electric polarization is produced in the c-axis direction.

CITATION LIST

Patent Literature

Patent Document No. 1: Japanese Patent Application Laid-Open Publication No. 2008-34889
Patent Document No. 2: Japanese Patent Application Laid-Open Publication No. 2002-16284

SUMMARY OF INVENTION

Technical Problem

It has been known that if an $Al_a Ga_b In_c N$ layer (where $0 < a \leq 1$, $0 \leq b$, $c \leq 1$ and $a+b+c=1$) including aluminum (Al) is deposited by metalorganic chemical vapor deposition (MOCVD) process while crystals of a gallium nitride-based compound semiconductor are growing, oxygen ($O_2$) atoms tend to enter the layer as an impurity. Such oxygen atoms that have entered the active layer as an impurity become non-radiative centers that will decrease the light-emitting efficiency of the element.

FIG. 5 is a cross-sectional view illustrating the structure of the semiconductor light-emitting element disclosed in Patent Document No. 1. In this semiconductor element 300, a first semiconductor layer 302 of AlGaAs has been deposited on a substrate 301, of which the principal surface is a c plane. An active layer 304 having a GaInNAs/GaAs double quantum well structure is arranged over the first semiconductor layer 302 and is sandwiched between two spacer layers 303 of GaAs. And a second semiconductor layer 305 of AlGaAs has been deposited on the upper spacer layer 303 on the active layer 304.

The semiconductor light-emitting element shown in FIG. 5 has a structure of which the first semiconductor layer 302 includes Al and the active layer 304 includes N. According to Patent Document No. 1, Al is detected in the active layer 304 of the semiconductor light-emitting element with such a structure. This is probably because Al that remains in the growth chamber while the active layer 304 is being formed should get bonded to a source material of a nitrogen compound, for example, and should enter the active layer 304.

Al and O have great bonding strength. That is why it is believed that if Al is included in the active layer 304, a very small number of oxygen atoms remaining in the reaction furnace or oxygen atoms included in a source gas supplied into the reaction furnace will get introduced into the crystals growing. As a result, the active layer 304 comes to have an increased oxygen concentration.

As a proof of this thinking, it is known that with an MBE (molecular beam epitaxy) process by which crystals can grow with a much higher degree of vacuum than in the MOCVD process, those oxygen atoms remaining in the reaction furnace will be eliminated completely and will never enter the active layer 304 as an impurity. Also, even with the MOCVD process adopted, if a $Ga_b In_c N$ layer (where $0 \leq b$, $c \leq 1$ and $a+b+c=1$) including no Al is formed, no oxygen atoms should enter the active layer, either.

According to Patent Document No. 1, by reducing the concentration of Al included in the active layer 304, the quantity of oxygen introduced as an impurity can be decreased and the light-emitting efficiency can be increased.

The present inventors tentatively formed an active layer 304, of which the surface is a c plane as in the active layer disclosed in Patent Document No. 1, and an active layer, of which the surface is an m plane, and observed how oxygen atoms would get introduced into those two layers. As a result, the present inventors discovered that oxygen atoms got introduced into the active layer with the m-plane surface differently from the active layer with the c-plane surface.

It is therefore an object of the present disclosure to provide an m-plane-growing nitride-based semiconductor element with high light-emitting efficiency and a method for fabricating such a semiconductor element.

Solution to Problem

A semiconductor light-emitting element according to the present disclosure includes an n-type gallium nitride-based compound semiconductor layer, a p-type gallium nitride-based compound semiconductor layer, and a light-emitting layer, which is interposed between the n- and p-type gallium nitride-based compound semiconductor layers. The light-emitting layer is an m-plane semiconductor layer, which includes an $In_x Ga_{1-x} N$ (where $0<x<1$) well layer that has a thickness of 6 nm or more and 17 nm or less, and oxygen atoms included in the light-emitting layer have a concentration of $3.0 \times 10^{17}$ $cm^{-3}$ or less.

In one embodiment, the $In_x Ga_{1-x} N$ (where $0<x<1$) well layer has a thickness of 8 nm or more and 16 nm or less.

In another embodiment, the light-emitting layer is a multi-quantum well active layer.

In still another embodiment, the light-emitting layer is supported by a substrate, and no Al atoms are included between the substrate and the light-emitting layer.

A method according to the present disclosure is designed to fabricate a semiconductor light-emitting element that includes an n-type gallium nitride-based compound semiconductor layer, a p-type gallium nitride-based compound semiconductor layer, and a light-emitting layer, which is interposed between the n- and p-type gallium nitride-based compound semiconductor layers. The method includes the steps of: (a) loading a substrate into a reaction chamber of a metalorganic chemical vapor deposition system; and (b) growing a (10-10) m-plane semiconductor layer, including an $In_x Ga_{1-x} N$ (where $0<x<1$) well layer that has a thickness of 6 nm or more and 17 nm or less, as a light-emitting layer on the substrate by performing a metalorganic chemical vapor deposition process. The step (b) includes setting the growth rate of the $In_x Ga_{1-x} N$ (where $0<x<1$) well layer so that oxygen atoms included in the light-emitting layer have a concentration of $3.0 \times 10^{17}$ $cm^{-3}$ or less.

In one embodiment, the step (b) includes growing the light-emitting layer at a growth rate of 7 nm per minute to 20 nm per minute.

In another embodiment, the step (b) includes growing the $In_x Ga_{1-x} N$ (where $0<x<1$) well layer to a thickness of 8 nm or more and 16 nm or less.

Advantageous Effects of Invention

According to the present disclosure, by setting the growth rate of the light-emitting layer to be relatively high, the quantity of oxygen to be introduced into the light-emitting layer as an impurity can be reduced. As a result, the number of non-radiative centers can be reduced in the light-emitting layer, and therefore, high light-emitting efficiency can be achieved.

Particularly if the thickness of the $In_x Ga_{1-x} N$ (where $0<x<1$) well layer included in the light-emitting layer is set to be 6 nm or more and 17 nm or less, the volume that can catch carriers can be increased so significantly that high light-emitting efficiency can be achieved eventually. Since the m-plane growth is never affected by the quantum confinement Stark effect, the thickness of the $In_x Ga_{1-x} N$ (where $0<x<1$) well layer can be increased to 6 nm or more.

Consequently, according to the present disclosure, high-efficiency LEDs can be manufactured with good stability without being affected by the quantum confinement Stark effect.

Figure 1:
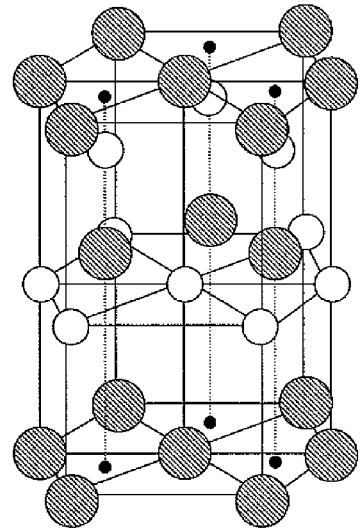
FIG. 1 is a perspective view schematically illustrating a unit cell of GaN.
Figure 1:
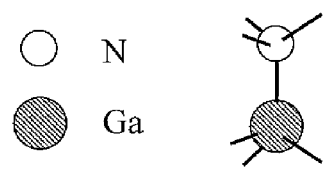
Figure 2:
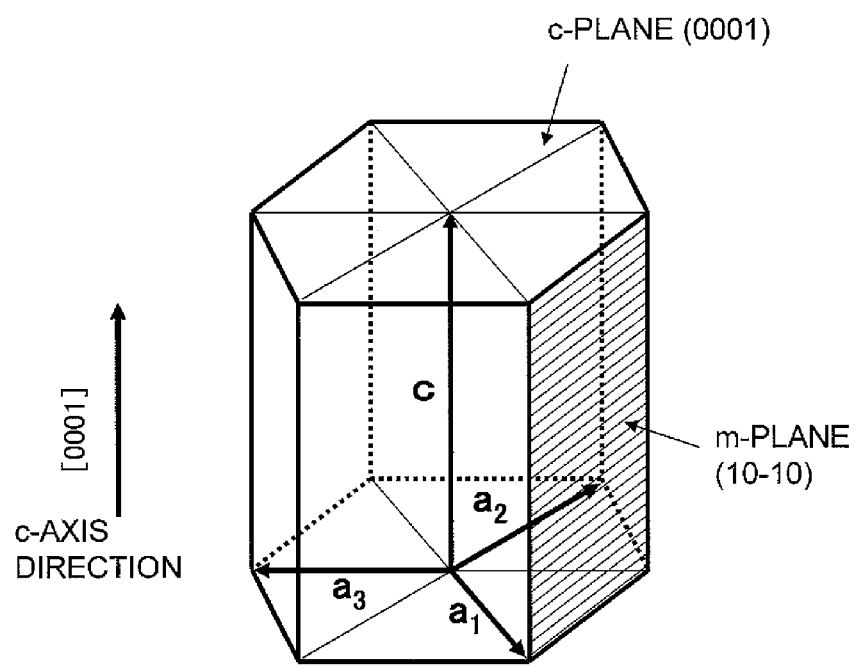
FIG. 2 is a perspective view showing the four primitive translation vectors $a_1$, $a_2$, $a_3$ and c of a wurtzite crystal structure.
Figure 3:
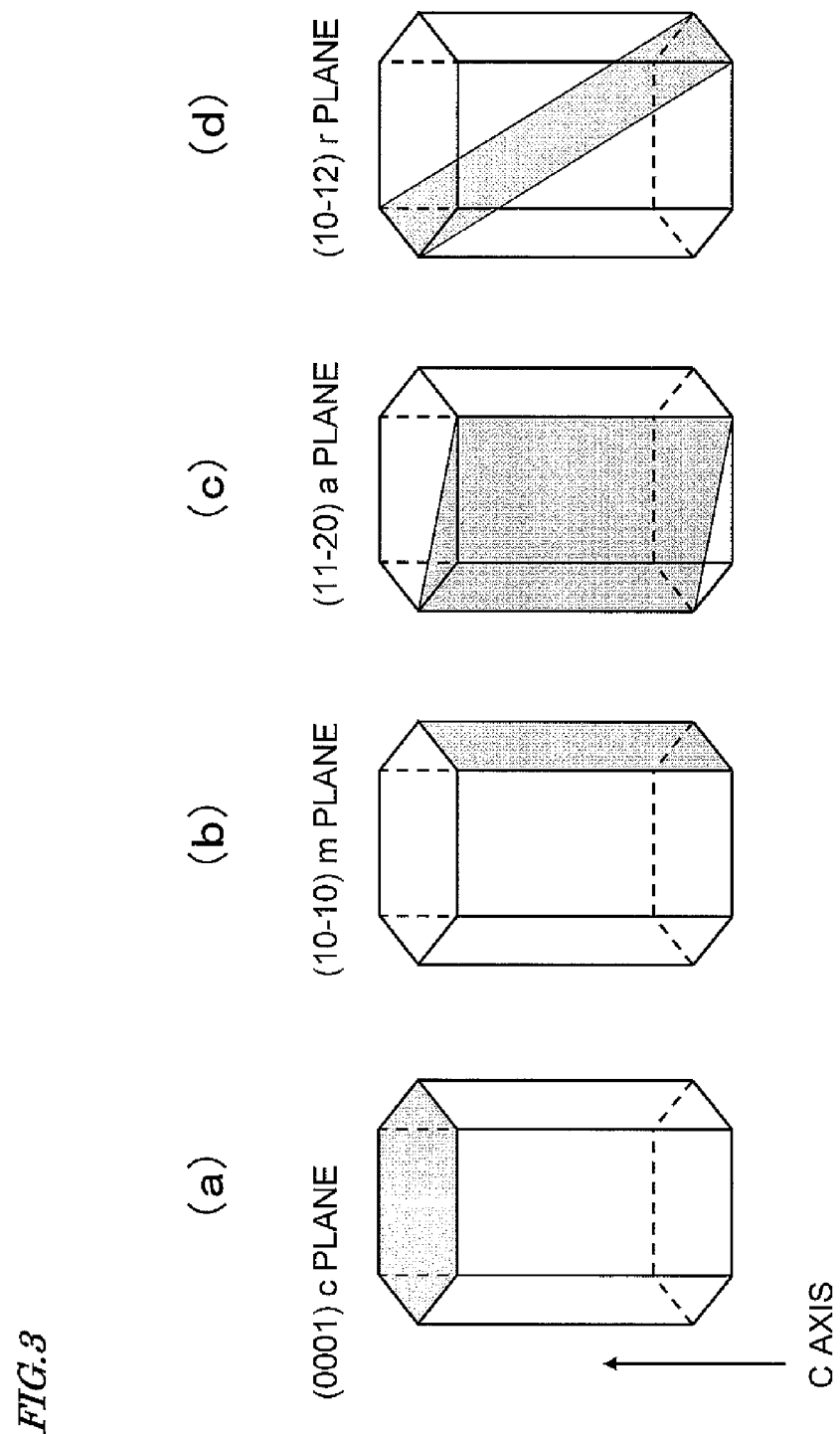

Portions (a) through (d) of FIG. 3 are schematic representations illustrating representative crystallographic plane orientations of a hexagonal wurtzite structure.

Figure 4:
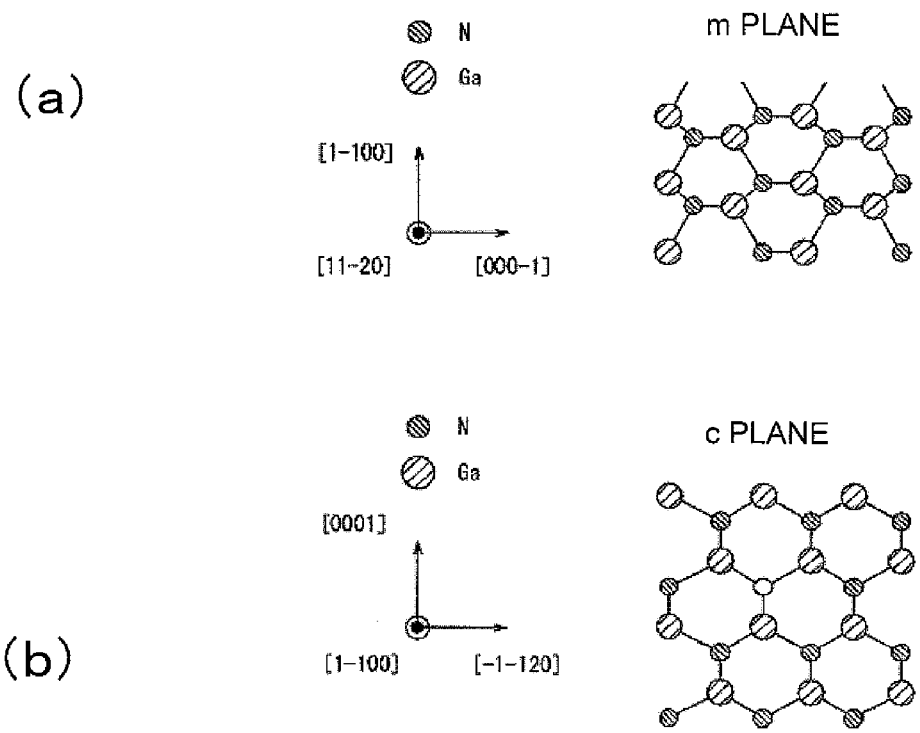

FIGS. 4(a) and 4(b) schematically illustrate the respective crystal structures of two nitride-based semiconductors, of which the principal surfaces are an m plane and a c plane, respectively, as viewed on a cross section thereof that intersects with the principal surface of the substrate at right angles.

Figure 5:
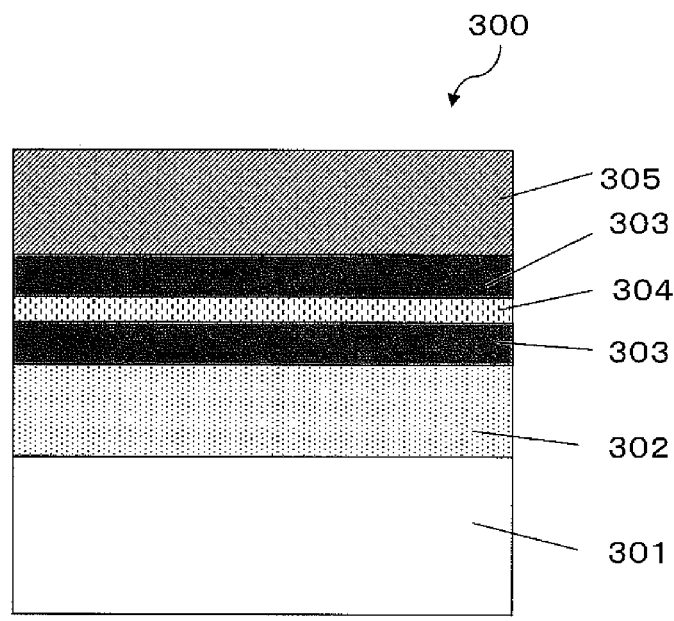

FIG. 5 is a cross-sectional view illustrating the structure of a semiconductor light emitting element as disclosed in Patent Document No. 1.

Figure 6:
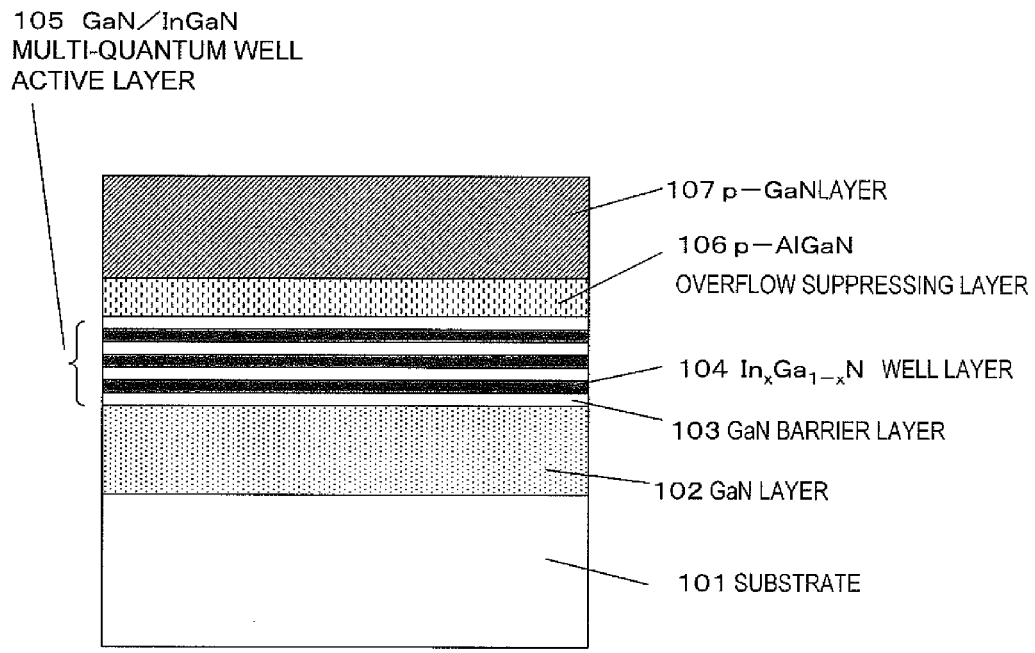

FIG. 6 is a cross-sectional view schematically illustrating the structure of an LED that has been formed through a c-plane crystal growing process.

Figure 7:
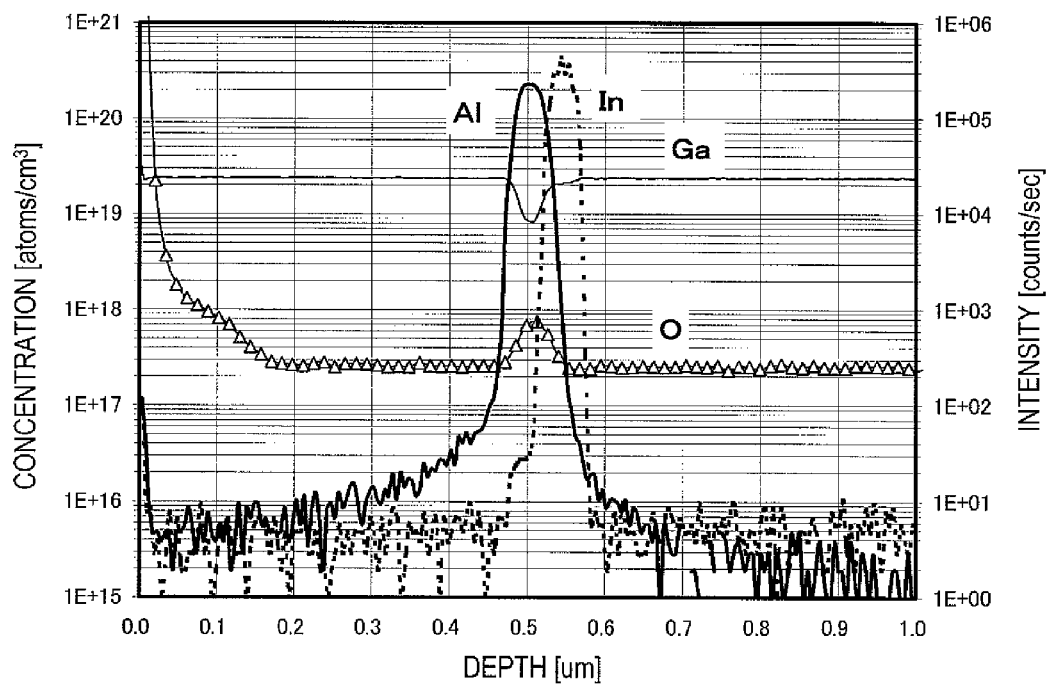

FIG. 7 is a graph showing the results of an SIMS analysis that was carried out on such an LED that was formed through the c-plane crystal growing process.

Figure 8:
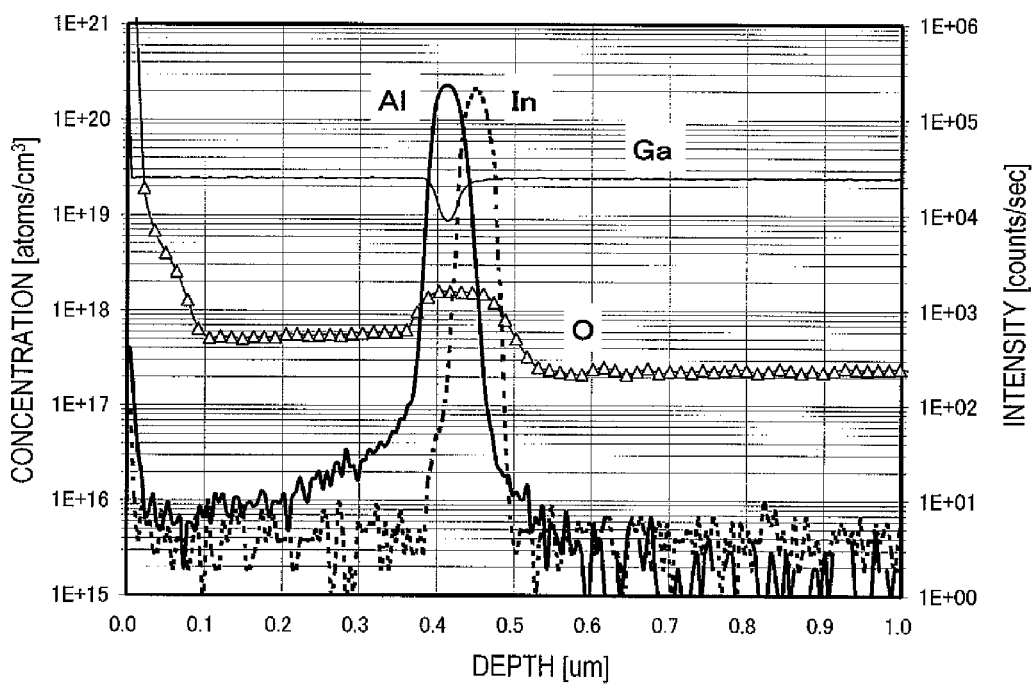

FIG. 8 is a graph showing the results of an SIMS analysis that was carried out on an LED that was formed through an m-plane crystal growing process.

Figure 9:
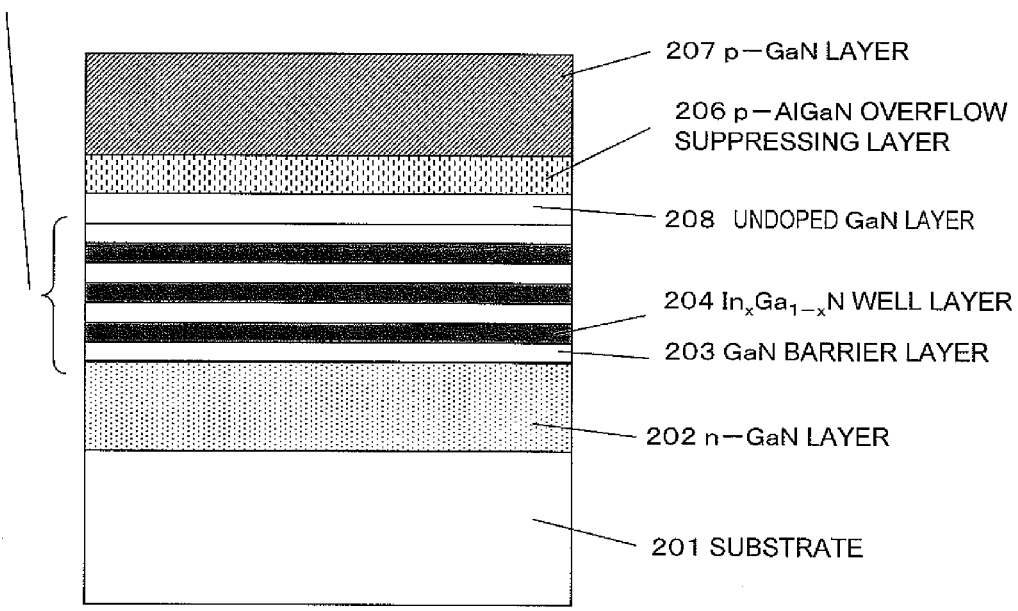

FIG. 9 is a cross-sectional view schematically illustrating the structure of an LED that has been fabricated with the growth rate of a GaN/InGaN multi-quantum well active layer 205 increased.

Figure 10:
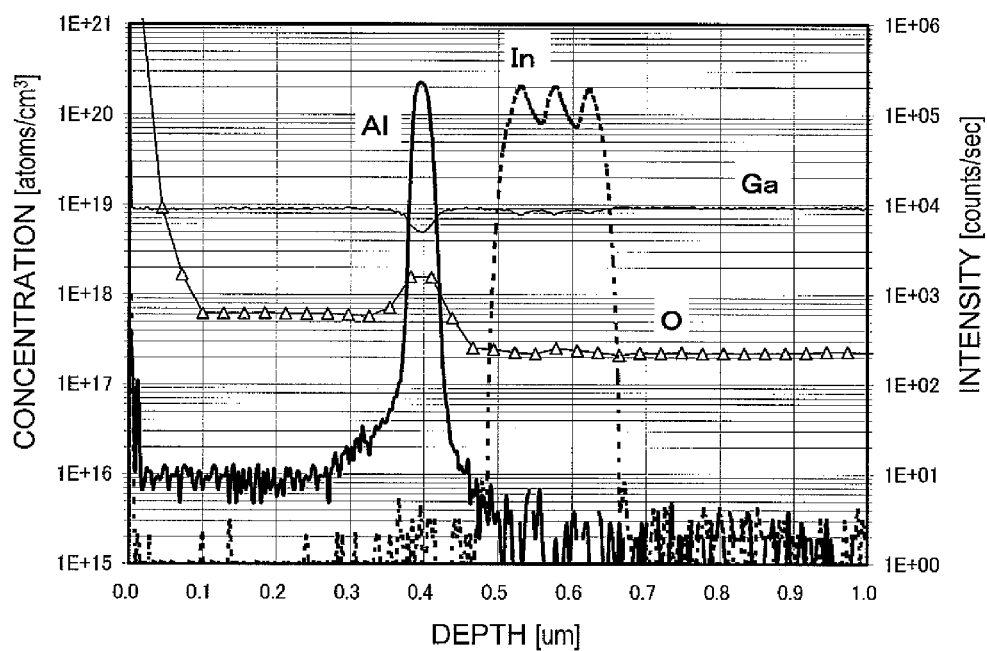

FIG. 10 is a graph showing the results of an SIMS analysis that was carried out on the LED shown in FIG. 9.

Figure 11:
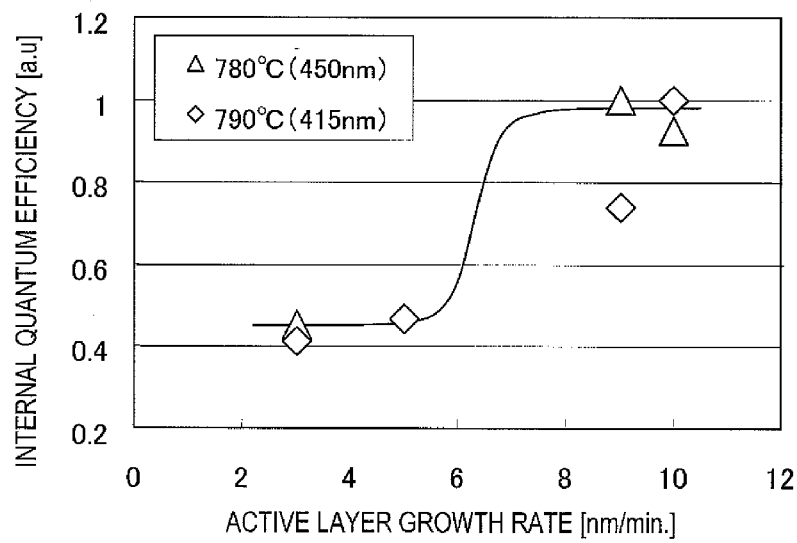

FIG. 11 is a graph showing how the internal quantum efficiency changes with the growth rate of a GaN/InGaN multi-quantum well active layer.

Figure 12:
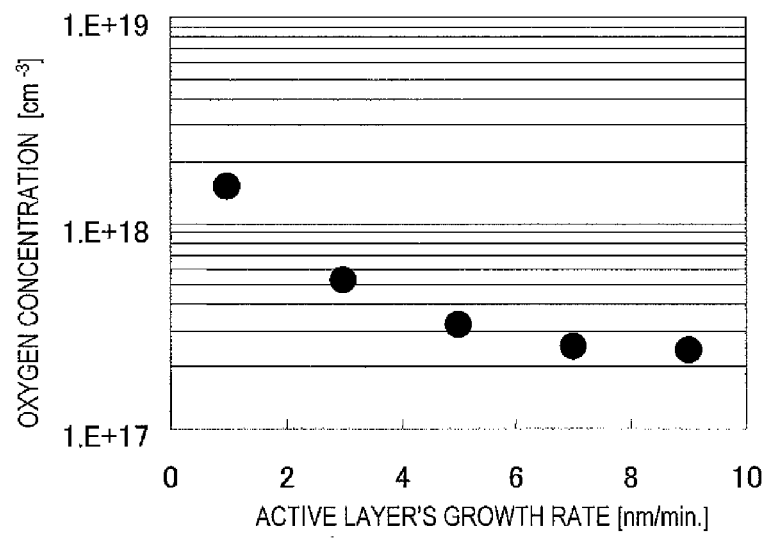

FIG. 12 is a graph showing how the concentration of oxygen atoms introduced unintentionally into the GaN/InGaN multi-quantum well active layer changes with the growth rate of that active layer.

Figure 13:
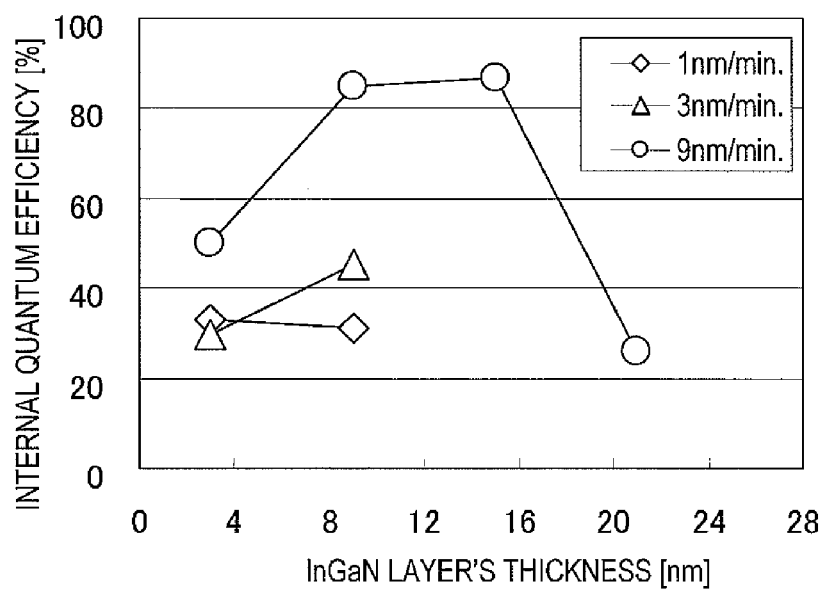

FIG. 13 is a graph showing how the internal quantum efficiency of a GaN/InGaN multi-quantum well active layer changes with the thickness of the InGaN well layers of that active layer.

Figure 14:
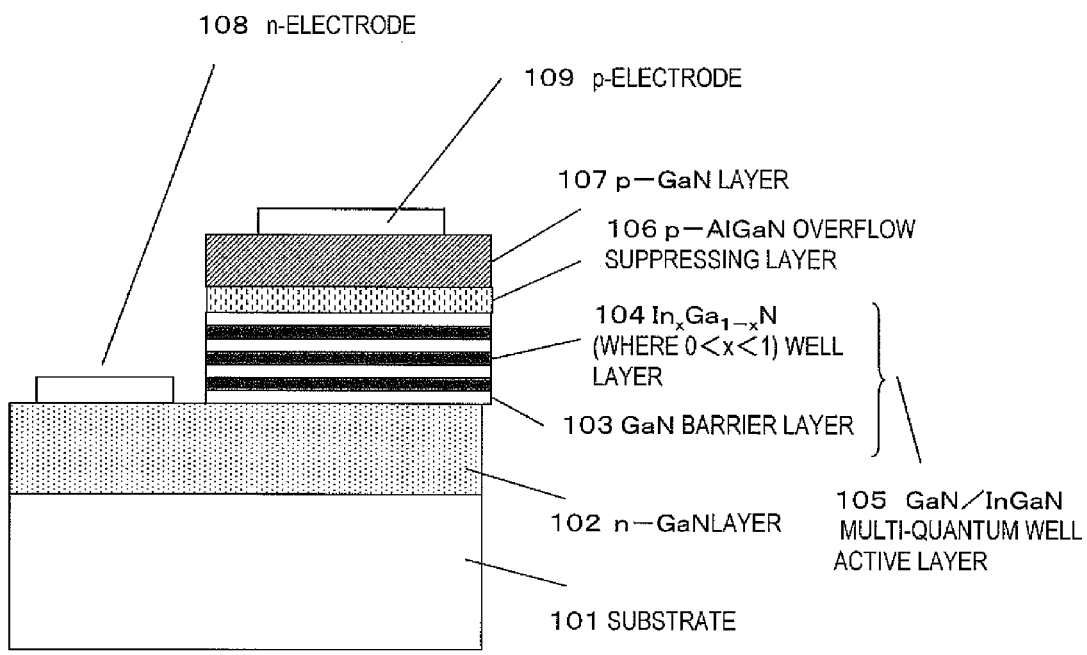

FIG. 14 is a schematic representation illustrating the structure of a gallium nitride-based compound semiconductor light-emitting element as an embodiment of the present disclosure.

DESCRIPTION OF EMBODIMENTS

FIG. 6 is a cross-sectional view illustrating the structure of an LED that was fabricated by the present inventors through a c-plane growth process. FIG. 7 is a graph showing the results obtained by carrying out an SIMS (secondary ion mass spectrometry) analysis on the LED shown in FIG. 6.

A c-plane GaN free-standing substrate was used as the substrate 101 shown in FIG. 6. On the substrate 101, deposited in this order are an n-GaN layer 102, a GaN/InGaN multi-quantum well active layer 105 to emit light, a p-AlGaN overflow suppressing layer 106 and a p-GaN layer 107. Each of these layers on the substrate 101 has been grown using a c plane as a crystal-growing plane. The GaN/InGaN multi-quantum well active layer 105 has a structure in which $In_xGa_{1-x}N$ (where $0<x<1$) well layers 104, each having a thickness of 3 nm, and GaN barrier layers 103, each having a thickness of 7 nm, have been alternately stacked one upon the other in, three cycles. That is to say, on the n-GaN layer 102, deposited is the first GaN barrier layer 103, on which the first $In_xGa_{1-x}N$ (where $0<x<1$) well layer 104 is stacked. The GaN/InGaN multi-quantum well active layer 105 includes three $In_xGa_{1-x}N$ (where $0<x<1$) well layers 104 and the fourth GaN barrier layer 103 is deposited on the third $In_xGa_{1-x}N$ (where $0<x<1$) well layer 104. In this case, the prefix "n-" and "p-" indicate that either silicon (Si) as an n-type dopant or magnesium (Mg) as a p-type dopant has been added to the layer in question. The p-AlGaN overflow suppressing layer 106 is a potential barrier layer that prevents n-type carriers (i.e., electrons) that have been injected from the n-GaN layer 102 from reaching the p-GaN layer 107 without getting caught in any of the $In_xGa_{1-x}N$ (where $0<x<1$) well layers 104. And the p-AlGaN overflow suppressing layer 106 has a thickness of approximately 20 nm.

In FIG. 7, the abscissa represents the depth (μm) as measured from the surface of the p-GaN layer 107 in this semiconductor multilayer structure. In the graph shown in FIG. 7, 0 μm corresponds to the surface of the p-GaN layer 107. Also, in FIG. 7, the fine-line, solid-line, dotted-line and triangle (Δ) curves indicate the profiles of Ga, Al, In and $O_2$, respectively. In this case, the profiles of Ga, Al and In are plotted with the ordinates on the right-hand side of FIG. 7 representing the intensity (counts/sec). On the other hand, the profile of $O_2$ is plotted with the ordinates on the left-hand side of FIG. 7 representing the concentration (density) (atoms/cm³). The depth at which the peak of the In curve is located indicates the position of the GaN/InGaN multi-quantum well active layer 105, while the depth at which the peak of the Al curve is located indicates the position of the p-AlGaN overflow suppressing layer 106.

The oxygen atoms are not a dopant that has been introduced into the crystals intentionally but an impurity that has either remained in the reaction furnace or been included in a source gas and has happened to enter the crystals in the end. According to the results shown in FIG. 7, except the vicinity of the uppermost surface, the profile of the oxygen atoms has an outstanding peak with a concentration of $8.0 \times 10^{17}$ cm$^{-3}$ only at the position where the p-AlGaN overflow suppressing layer 106 is located (i.e., at the peak of the Al curve). Based on this result, the present inventors confirmed that oxygen atoms as an impurity were likely to enter such an Al-including layer. As also can be seen from FIG. 7, the concentration of oxygen at the position where the GaN/InGaN multi-quantum well active layer 105 is located (i.e., at the peak of the In curve) is almost as high as at any other position where neither the GaN/InGaN multi-quantum well active layer 105 nor the p-AlGaN overflow suppressing layer 106 is located. This result reveals that not so much oxygen as an impurity has entered the GaN/InGaN multi-quantum well active layer 105. It should be noted that the oxygen concentration shown in FIG. 7 is higher than $1.0 \times 10^{15}$ cm$^{-3}$.

The present inventors tentatively made an LED having the same structure as the LED shown in FIG. 6 except its m-plane surface as a comparative example and carried out an SIMS analysis on that LED. FIG. 8 shows the results of the SIMS experiment on such an LED that was fabricated through the m-plane crystal-growing process. That LED had the same structure as what is shown in FIG. 6 except that an m-plane GaN free-standing substrate was used as its substrate 101 and was fabricated under the quite the same crystal-growing process conditions as the c-plane crystal-growing process conditions. Since the principal surface of its substrate 101 was an m plane, the crystal-growing plane of each and every layer deposited on the substrate 101 was an m plane.

As can be seen from the graph shown in FIG. 8, the concentration of oxygen was high at not only the position where the p-AlGaN overflow suppressing layer 106 was located (i.e., at the peak of the Al curve) but also the position where the GaN/InGaN multi-quantum well active layer 105 was located (i.e., at the peak of the In curve). Specifically, the concentration of oxygen in the GaN/InGaN multi-quantum well active layer 105 was $1.5 \times 10^{18}$ cm$^{-3}$, which was as high as in the p-AlGaN overflow suppressing layer 106. Consequently, the present inventors discovered that if the m-plane crystal-growing process was performed, oxygen atoms as an impurity entered the GaN/InGaN multi-quantum well active layer 105, too.

Next, the present inventors tentatively made another LED with the growth rate of the GaN/InGaN multi-quantum well active layer 105 increased and carried out an SIMS analysis on that LED, too. The structure of that LED is shown in FIG. 9. The differences between the two LEDs shown in FIGS. 9 and 6 are summarized in the following Table 1:

TABLE 1

| | Crystal-growing plane | Thickness of active layer (InGaN well layer/GaN barrier layer) | Have undoped GaN layer? | Growth rate of active layer |
|---|---|---|---|---|
| FIG. 6 | c plane | 3 nm/7 nm | NO | 1 nm/min |
| FIG. 9 | m plane | 15 nm/30 nm | YES | 9 nm/min |

The LED shown in FIG. 9 uses an m-plane GaN free-standing substrate as its substrate 201. That is why the crystal-growing plane of each and every layer deposited on the substrate 201 (i.e., from the n-GaN layer 202 through the p-GaN layer 207 thereof) is an m plane. The GaN/InGaN multi-quantum well active layer 205 has a structure in which $In_xGa_{1-x}N$ (where $0<x<1$) well layers 204, each having a thickness of 15 nm, and GaN barrier layers 203, each having a thickness of 30 nm, have been alternately stacked one upon the other in three cycles. Also, an undoped GaN layer 208 with a thickness of 100 nm is inserted between the GaN/InGaN multi-quantum well active layer 204 and the p-AlGaN overflow suppressing layer 206.

Furthermore, the GaN/InGaN multi-quantum well active layer 205 shown in FIG. 9 was formed at a growth rate of 9 nm per minute. In the LED shown in FIG. 6 (i.e., the LED that was used to make the analysis shown in FIGS. 7 and 8), on the other hand, the growth rate of the GaN/InGaN multi-quantum well active layer 205 was 1 nm per minute. Other than these respects, the structure and the manufacturing process of the LED shown in FIG. 9 are the same as those of its counterpart shown in FIG. 6. That is why description of their common structural and manufacturing process features will be omitted herein.

It should be noted that the $In_xGa_{1-x}N$ well layers 204 were grown with plenty of ammonia supplied as the source of nitrogen. Among various Group III atoms, In is one of the atoms that will vaporize most easily. That is why it is just the supply rate of Ga atoms that would determine the growth rate of the $In_xGa_{1-x}N$ well layers 204. Likewise, the GaN barrier layers 203 were grown with plenty of ammonia supplied as the source of nitrogen, and therefore, only the supply rate of Ga atoms would determine the growth rate of the GaN barrier layers 203. Consequently, the growth rate of the GaN/InGaN multi-quantum well active layer 205 can be controlled easily just by adjusting the flow rate of the trimethylgallium (TMG) or triethylgallium (TEG) gas as the Ga source gas. And the growth rate can be calculated based on the film thickness measured by X-ray diffraction and the growing process time.

FIG. 10 shows the results of an SIMS analysis that was carried out on the LED shown in FIG. 9. The LED shown in FIG. 9 has thicker $In_xGa_{1-x}N$ well layers 204 than the LED shown in FIG. 6. Also, the LED shown in FIG. 9 has thicker GaN barrier layers 203, and therefore, a broader gap between the $In_xGa_{1-x}N$ well layers 204, than the LED shown in FIG. 6. That is why although the In curve had only one peak detected according to the results of measurements shown in FIGS. 7 and 8, the In curve had as many peaks as the number of $In_xGa_{1-x}N$ well layers 204 actually provided according to the results of measurements shown in FIG. 10.

According to the results shown in the graph of FIG. 10, the oxygen concentration at the position where the GaN/InGaN multi-quantum well active layer 205 is located (i.e., at the peak of the In curve) is lower than the oxygen concentration at the position where the p-AlGaN overflow suppressing layer 206 is located (i.e., at the peak of the Al curve). The GaN/InGaN multi-quantum well active layer 205 has an oxygen concentration of $2.5\times10^{17}$ $cm^{-3}$, which is approximately as high as the oxygen concentration in the regions other than the GaN/InGaN multi-quantum well active layer 205 and the p-AlGaN overflow suppressing layer 206. Also, this oxygen concentration is approximately one-tenth of that of the GaN/InGaN multi-quantum well active layer 105 ($1.5\times10^{18}$ $cm^{-3}$) in the graph shown in FIG. 8.

Considering the results shown in FIGS. 10 and 8, it can be said that in an m-plane crystal-growing process, it will depend heavily on the growth rate of the GaN/InGaN multi-quantum well active layer 205 whether or not oxygen will enter the GaN/InGaN multi-quantum well active layer 205 including no Al. In the c-plane-growing GaN/InGaN multi-quantum well active layer, on the other hand, as long as there is no Al in the reaction chamber, oxygen or any other impurity will never enter that active layer, no matter whether the growth rate is high or low. That is why it can be said that the m plane should be a crystallographic plane orientation which oxygen or any other impurity will enter easily in the first place. As a proof of this, the concentration of oxygen atoms in the p-AlGaN overflow suppressing layer 106 was $8.0\times10^{17}$ $cm^{-3}$ in the case of the c-plane growth shown in FIG. 7 but almost doubled to $1.5\times10^{18}$ $cm^{-3}$ in the case of the m-plane growth shown in FIG. 8.

It is not known exactly why the unintentional introduction of oxygen as an impurity can be minimized by increasing the growth rate. This is probably because in such a situation, the crystals would grow too fast one after another to give the impurity oxygen a chance to enter the active layer. That way, the unintentional introduction of oxygen can be avoided after all.

The present inventors carried out experiments to find how high the growth rate and oxygen concentration of the GaN/InGaN multi-quantum well active layer should be in order to achieve sufficient internal quantum efficiency. The results are as follows.

FIG. 11 shows how the internal quantum efficiency changes with the growth rate of a GaN/InGaN multi-quantum well active layer, of which the crystal-growing plane is an m plane. The results shown in FIG. 11 were obtained using a sample in which an undoped GaN layer was deposited to a thickness of 1.5 μm to 2.5 μm on an m-plane substrate and then a GaN/InGaN multi-quantum well active layer (including InGaN well layers with a thickness of 3 nm each and GaN barrier layers with a thickness of 7 nm each, which had been stacked one upon the other in three cycles) was deposited thereon.

In the graph shown in FIG. 11, the abscissa represents the growth rate and the ordinate represents the internal quantum efficiency, which is the ratio of the integral intensity of a photoluminescence (PL) spectrum that was measured at a low temperature of 10 K to that of a photoluminescence (PL) spectrum that was measured at room temperature of 300 K.

Also, in FIG. 11, the open triangles △ indicates the results of measurement obtained from a sample in which the growing process temperature was fixed at 780° C., when the GaN/InGaN multi-quantum well active layer was deposited and which had an emission peak wavelength of 450±10 nm. On the other hand, the open diamonds ◇ indicates the results of measurement obtained from a sample in which the growing process temperature was fixed at 790° C. and which had an emission peak wavelength of 415±10 nm. Furthermore, in FIG. 11, the data obtained under these two conditions are normalized with respect to the highest internal quantum efficiency that is supposed to be one.

According to the growing process condition, the composition of the respective elements of the $In_xGa_{1-x}N$ well layer, and eventually the emission peak wavelength, could change significantly. For example, at a growing process temperature of 780° C., if the growth rate is in the range of 4 to 8 nm per minute, then the emission peak wavelength will be too long to fall within the range of 450±10 nm. That is why when the growing process temperature is 780° C., then the growth rate range of 4 to 8 nm per minute is excluded from the object of comparison. In the same way, at a growing process temperature of 790° C., if the growth rate is in the range of 6 to 8 nm per minute, then the emission peak wavelength will be too long to fall within the range of 415±10 nm. That is why when the growing process temperature is 780° C., then the growth rate range of 6 to 8 nm per minute is excluded from the object of comparison. It should be noted that the emission peak wavelength was extracted from the PL spectrum that was measured at room temperature of 300 K.

As can be seen from the results shown in FIG. 11, even if samples having the same structure and the same emission peak wavelength were made at the same growing process temperature, the higher the growth rate of the GaN/InGaN multi-quantum well active layer, the higher the internal quantum efficiency tended to be. This should be because if the growth rate of the GaN/InGaN multi-quantum well active layer is increased, the concentration of the oxygen atoms introduced unintentionally as an impurity decreases, and therefore, the number of non-radiative centers in the GaN/InGaN multi-quantum well active layer decreases, too.

Specifically, a growth rate of approximately 7 nm per minute is a threshold value, at or over which the internal quantum efficiency (that is a normalized value) tends to increase steeply. Also, if the growth rate is equal to or higher than 9 nm per minute, the internal quantum efficiency tends to get substantially saturated.

It should be noted that the GaN/InGaN multi-quantum well active layer includes $In_xGa_{1-x}N$ well layers and GaN barrier layers. In this case, the growth rates of the $In_xGa_{1-x}N$ well layers and GaN barrier layers may be either equal to each other or different from each other. No matter whether the respective growth rates of the $In_xGa_{1-x}N$ well layers and the GaN barrier layers are the same or different, the "growth rate of the GaN/InGaN multi-quantum well active layer" is a value obtained by subtracting the thickness of the GaN/InGaN multi-quantum well active layer by the amount of time it has taken to grow that active layer.

Based on the results of measurement shown in FIG. 11, the present inventors confirmed that when the active layer emitted light with an emission wavelength of approximately 400-450 nm, the internal quantum efficiency could be increased by raising the growth rate. Nevertheless, it is apparent that even if the active layer emits a near-ultraviolet ray (at a wavelength of around 380 nm) or a green ray (at a wavelength of around 520 nm), the effect of increasing the internal quantum efficiency can also be achieved by raising the growth rate.

FIG. 12 is a graph showing how the concentration of oxygen atoms introduced unintentionally into the GaN/InGaN multi-quantum well active layer changes with the growth rate of that active layer. The concentration of oxygen atoms was obtained by carrying out an SIMS analysis. The quantity of the oxygen atoms introduced unintentionally when the GaN/InGaN multi-quantum well active layer was grown at a rate of 1 nm per minute was $1.5 \times 10^{18}$ cm$^{-3}$ but was decreased monotonically as the growth rate was raised. And when the growth rate was 3 nm per minute, the concentration of oxygen introduced was approximately $5.3 \times 10^{17}$ cm$^{-3}$. Thereafter, when the growth rate was raised to 5 nm per minute and to 7 nm per minute, the oxygen concentration decreased to $3.2 \times 10^{17}$ cm$^{-3}$ and then to $3.0 \times 10^{17}$ cm$^{-3}$ or less, respectively. But once the growth rate exceeded 7 nm per minute, the oxygen concentration hardly varies anymore and converged to around $2.5 \times 10^{17}$ cm$^{-3}$ in the end. As already described with reference to FIG. 11, if the growth rate of the GaN/InGaN multi-quantum well active layer 205 becomes equal to or higher than 7 nm per minute, the internal quantum efficiency (that is a normalized value) would tend to increase significantly. Taking these results into consideration, if the oxygen concentration is equal to or lower than $3.0 \times 10^{17}$ cm$^{-3}$, no adverse influence that might deteriorate the light-emitting characteristic should be caused by the impurity oxygen but the expected internal quantum efficiency should be achieved.

As also can be seen from FIG. 11, if the growth rate of the GaN/InGaN multi-quantum well active layer 205 was equal to or higher than 9 nm per minute, the internal quantum efficiency tended to get saturated. According to the results shown in FIG. 12, on the other hand, if the growth rate was equal to or higher than 9 nm per minute, the oxygen concentration got closer to $2.5 \times 10^{17}$ cm$^{-3}$. These results reveal that if the oxygen concentration is equal to or smaller than $2.5 \times 10^{17}$ cm$^{-3}$, even higher internal quantum efficiency can be achieved.

Based on the results of the SIMS analysis, the present inventors discovered that the quantity of oxygen atoms introduced as an impurity into the GaN/InGaN multi-quantum well active layer could be controlled only by the growth rate. In other words, the present inventors discovered that the quantity of oxygen atoms introduced unintentionally into the GaN/InGaN multi-quantum well active layer did not depend on the thickness of the GaN/InGaN multi-quantum well active layer 205 or the In mole fraction (x) of the $In_xGa_{1-x}N$ (where 0<x<1) well layers.

The present inventors carried out experiments to find an appropriate thickness of the $In_xGa_{1-x}N$ (where 0<x<1) well layers. The results are as follows. FIG. 13 is a graph showing how the internal quantum efficiency changes with the thickness of the InGaN well layers. In FIG. 13, the open diamonds ◇ indicate the results obtained from samples, of which the GaN/InGaN multi-quantum well active layer was grown at a rate of 1 nm per minute. The open triangles Δ indicate the results obtained from samples, of which the GaN/InGaN multi-quantum well active layer was grown at a rate of 3 nm per minute. And the open circles ○ indicate the results obtained from samples, of which the GaN/InGaN multi-quantum well active layer was grown at a rate of 9 nm per minute.

As shown in FIG. 13, at growth rates of 1 nm per minute and 3 nm per minute, internal quantum efficiency exceeding 50% could not be achieved irrespective of the thickness of the InGaN well layers. On the other hand, when the growth rate was 9 nm per minute (as indicated by the open circles ○ in FIG. 13), samples, of which the InGaN well layers had a thickness of 3 nm or more and 15 nm or less, respectively, achieved an internal quantum efficiency of more than 50%. Comparing the samples, of which the InGaN well layer had a thickness of 3 nm, to each other, it can be seen that the internal quantum efficiency (of approximately 50%) achieved by the sample that had been grown at a rate of 9 nm per minute was at least 1.5 times as high as the internal quantum efficiency (of approximately 30%) achieved by the samples that had been grown at rates of 1 nm per minute and 3 nm per minute, respectively. As shown in FIG. 12, the higher the growth rate, the lower the quantity of oxygen atoms introduced as an impurity. That is why such a rise in internal quantum efficiency would have been caused by a decrease in the number of non-radiative centers in the GaN/InGaN multi-quantum well active layer.

Generally speaking, the thicker the InGaN well layers, the greater the volume in which carriers contributing to emission of light can be caught and the higher the internal quantum efficiency. However, at a growth rate of 1 nm per minute (as indicated by the open diamonds ◇ in FIG. 13), even if the thickness of the InGaN well layers was increased from 3 nm to 9 nm, the internal quantum efficiency almost remained unchanged at around 30% and could not be increased effectively. On the other hand, at a growth rate of 3 nm per minute (as indicated by the open triangles A in FIG. 13), if the thickness of the InGaN well layers was increased from 3 nm to 9 nm, the internal quantum efficiency did increase. Nevertheless, even when the InGaN well layers had a thickness of 9 nm, the internal quantum efficiency was still less than 50%.

Meanwhile, at a growth rate of 9 nm per minute, when the InGaN well layers had a thickness of 9 nm, the internal quantum efficiency achieved was 85%. It must be said that this is quite an increase in internal quantum efficiency compared to the value of approximately 50% achieved when each of the InGaN well layers was grown to a thickness of 3 nm at the same growth rate. This result reveals that at the growth rate of 9 nm per minute, the effect of increasing the volume of the carrier catchable region by increasing the thickness of the InGaN well layers could be achieved significantly.

Moreover, that internal quantum efficiency of as high as 85% is more than twice, and almost twice, as high as internal quantum efficiencies of approximately 30% and approximately 45% that were achieved when a sample including InGaN well layers with a thickness of 9 nm was made at growth rates of 1 nm per minute and 3 nm per minute, respectively. These results reveal that unless the concentration of oxygen atoms introduced as an impurity is reduced sufficiently by appropriately increasing the growth rate of the GaN/InGaN multi-quantum well active layers, the internal quantum efficiency cannot be increased significantly, no matter how much the thickness of the InGaN well layers is increased.

If the GaN/InGaN multi-quantum well active layer was grown at a rate of 9 nm per minute so that each of the InGaN well layers would have a thickness of 15 nm, the internal quantum efficiency achieved was as high as 87%. Nevertheless, if the thickness of the InGaN well layers was increased to 21 nm, the efficiency decreased steeply. As can be seen from the results shown in FIG. 13, if the InGaN well layers had a thickness falling within the range of about 8 nm to about 16 nm, the internal quantum efficiency achieved was 80% or more. Once the thickness of the $In_xGa_{1-x}N$ (where 0<x<1) well layers exceeded 15 nm, the internal quantum efficiency decreased. This is probably because the stress caused by the strain would have produced dislocations, defects and other lattice mismatches and increased the number of non-radiative centers.

It is not too much to say that an internal quantum efficiency of approximately 90% is already close to the upper limit. They say that an internal quantum efficiency of approximately 70% is required in practice. According to the graph shown in FIG. 13, the thickness of the InGaN well layers, at which the internal quantum efficiency becomes 70% or more at a growth rate of 9 nm, is in the range of approximately 6 nm to approximately 17 nm.

EMBODIMENTS

Hereinafter, an embodiment of a gallium nitride-based compound semiconductor light-emitting element according to the present disclosure will be described with reference to FIG. 14.

The semiconductor light-emitting element of this embodiment includes an n-GaN layer 102, a p-GaN layer 107 and an GaN/InGaN multi-quantum well active layer 105 that is interposed between them.

The n-GaN layer 102 has been deposited on a crystal-growing substrate 101, of which the principal surface is an m plane. The GaN/InGaN multi-quantum well active layer 105 has been formed on a portion of the n-GaN layer 102. On the rest of the n-GaN layer 102 where the GaN/InGaN multi-quantum well active layer 105 is not located, an n-electrode 108 has been formed.

The GaN/InGaN multi-quantum well active layer 105 has a structure in which $In_xGa_{1-x}N$ (where 0<x<(1) well layers 104 and GaN barrier layers 103 have been alternately stacked one upon the other. On the GaN/InGaN multi-quantum well active layer 105, arranged is a p-AlGaN overflow suppressing layer 106, on which the p-GaN layer 107 has been stacked. And a p-electrode 109 is arranged on the p-GaN layer 107.

The GaN/InGaN multi-quantum well active layer 105 is an m-plane semiconductor layer including $In_xGa_{1-x}N$ (where 0<x<1) well layers 104, each having a thickness of 6 nm or more and 17 nm or less, and the concentration of oxygen atoms included in the GaN/InGaN multi-quantum well active layer 105 is $3.0 \times 10^{17}$ $cm^{-3}$ or less.

In this description, the "concentration of oxygen atoms included in the GaN/InGaN multi-quantum well active layer (light-emitting layer) 105" means the average of the respective concentrations of oxygen included in the $In_xGa_{1-x}N$ (where 0<x<1) well layers 104 and the GaN barrier layers 103. Specifically, the oxygen atom concentration is calculated by dividing the quantity of oxygen atoms (unit: atoms) included in the entire GaN/InGaN multi-quantum well active layer 105 (i.e., every $In_xGa_{1-x}N$ (where 0<x<1) well layer 104 and every GaN barrier layer 103 combined) by the overall volume of the GaN/InGaN multi-quantum well active layer 105. The quantity of oxygen atoms included in the entire GaN/InGaN multi-quantum well active layer 105 can be obtained by making an SIMS analysis. The volume of the GaN/InGaN multi-quantum well active layer 105 can be obtained by multiplying together the thickness of the GaN/InGaN multi-quantum well active layer 105 and the area of its portion to be subjected to a sputtering process. The thickness of the GaN/InGaN multi-quantum well active layer 105 can be measured by X-ray diffraction.

As described above, the present inventors discovered that the oxygen concentration of the GaN/InGaN multi-quantum well active layer 105 can be reduced by increasing its growth rate. In this embodiment, the GaN/InGaN multi-quantum well active layer 105 is formed by MOCVD process. As already described with reference to FIG. 12, by forming the GaN/InGaN multi-quantum well active layer 105 at a growth rate of 7 nm per minute to 20 nm per minute, the concentration of oxygen atoms included in the GaN/InGaN multi-quantum well active layer 105 can be reduced to $3.0 \times 10^{17}$ $cm^{-3}$ or less. The GaN/InGaN multi-quantum well active layer 105 can be grown at 790° C., for example.

Also, as already described with reference to FIG. 13, by setting the thickness of the $In_xGa_{1-x}N$ (where $0<x<1$) well layers 104 to fall within the range of 6 nm or more and 17 nm or less, the internal quantum efficiency can be increased to 70% or more.

Hereinafter, it will be described exactly how to fabricate the semiconductor light-emitting element of this embodiment.

In this embodiment, a wafer on which (10-10) m-plane gallium nitride (GaN) can be grown is used as the crystal-growing substrate 101. Such a crystal-growing substrate 101 is most preferably a gallium nitride free-standing substrate, of which the principal surface is an m-plane, but may also be a silicon carbide (SiC) substrate with a 4H or 6H structure and with an m-plane principal surface because the lattice constant of SiC is rather close to that of GaN. Alternatively, a sapphire substrate that also has an m-plane principal surface can be used, too. In any case, if a non-gallium nitride-based compound semiconductor substrate is used as the crystal-growing substrate 101, an appropriate spacer layer or buffer layer is preferably inserted between the crystal-growing substrate 101 and the gallium nitride-based compound semiconductor layers to be formed thereon.

It should be noted that the surface (more particularly, the principal surface) of an actual m-plane semiconductor layer does not always have to be perfectly parallel to an m plane but may define a very small tilt angle (which is greater than 0 degrees but less than ±1 degree) with respect to the m plane. According to the manufacturing process technologies currently available, it is difficult to make a substrate or a semiconductor layer so that their surface is 100% parallel to an m plane. That is to say, if an m-plane substrate or an m-plane semiconductor layer is made by current manufacturing process technologies, the actual surface will slightly tilt with respect to the ideal m plane. However, as the tilt angle and tilt direction will vary from one manufacturing process to another, it is difficult to accurately control the tilt angle and tilt direction of the surface. Thus, according to the present disclosure, an m-plane semiconductor layer can naturally be a semiconductor layer, of which the surface (more particularly, the principal surface) is perfectly parallel to an m plane, but may also be a semiconductor layer, of which the surface defines a very small tilt angle (which may be greater than 0 degrees but less than ±1 degree, for example) with respect to the m plane.

The gallium nitride-based compound semiconductor to form the GaN/InGaN multi-quantum well active layer 105 and other layers is deposited by performing an MOCVD process. First of all, the substrate 101 is washed with a buffered hydrofluoric acid (BHF) solution, rinsed with water, and then dried sufficiently. The substrate 101 that has been washed in this manner is transported to the reaction chamber of an MOCVD system while avoiding exposing it to the air as successfully as possible. Thereafter, while supplying nitrogen ($N_2$) and hydrogen ($H_2$) gases as carrier gases and only ammonia gas as a nitrogen source gas, the substrate is heated to 850° C., thereby do cleaning on the surface of the substrate 101.

Next, with the nitrogen, hydrogen and ammonia gases supplied continuously, a trimethylgallium (TMG) gas or a triethylgallium (TEG) gas and a silane ($SiH_4$) gas start to be supplied and the substrate is heated to about 1100° C., thereby depositing an n-GaN layer 102. The silane gas is the source gas of Si as an n-type dopant.

Next, the supply of the $SiH_4$ gas is stopped and the temperature of the substrate is lowered to less than 800° C., thereby forming a GaN barrier layer 103. In this process step, $N_2$, trimethylgallium (TMG) or triethylgallium (TEG), and ammonia gases are supplied at respective flow rates of 15 to 20 slm, 4 to 10 sccm, and 15 to 20 slm into the reaction chamber. In addition, a trimethylindium (TMI) gas also starts to be supplied at a flow rate of 300 to 600 sccm, thereby forming an $In_xGa_{1-x}N$ (where $0<x<1$) well layer 104. And by alternately forming the GaN barrier layers 103 and $In_xGa_{1-x}N$ (where $0<x<1$) well layers 104 in three or more cycles, a GaN/InGaN multi-quantum well active layer 105 that will emit light is formed. In this case, these layers are formed in three or more cycles because the larger the number of the $In_xGa_{1-x}N$ (where $0<x<1$) well layers 104, the greater the volume in which carriers contributing to radiative recombination can be caught and the higher the efficiency of the element should be.

If an m-plane growing process is carried out, it is effective to increase the thickness of the $In_xGa_{1-x}N$ (where $0<x<1$) well layers 104 in order to increase the carrier catching volume. Since a non-negligible quantum confinement Stark effect will be produced in the conventional (0001) c-plane growing process, it is difficult to increase the thickness of the $In_xGa_{1-x}N$ (where $0<x<1$) well layers 104. This is because in order to nullify the quantum confinement Stark effect as perfectly as possible, the thickness of the $In_xGa_{1-x}N$ (where $0<x<1$) well layers 104 needs to be reduced to a certain degree, typically to 5 nm or less. On the other hand, on an m plane and other non-polar planes, no quantum confinement Stark effect will be produced in the first place. That is why in the case of the m-plane growth, the thickness of the $In_xGa_{1-x}N$ (where $0<x<1$) well layers 104 does not have to be reduced unlike the c-plane growth. For that reason, according to the m-plane growth, the thickness of the $In_xGa_{1-x}N$ (where $0<x<1$) well layers 104 can be within the range of 6 nm or more and 17 nm or less without being affected by the quantum confinement Stark effect. As a result, high internal quantum efficiency can be achieved.

In depositing $In_xGa_{1-x}N$ (where $0<x<1$) well layers 104 and GaN barrier layers 103, their growing process conditions are preferably controlled so that the GaN/InGaN multi-quantum well active layer 105 grows at a rate of 7 nm per minute or more. According to the data shown in FIG. 12, by setting its growth rate to be 7 nm per minute or more, the concentration of oxygen atoms to be introduced as an impurity into the GaN/InGaN multi-quantum well active layer can be reduced to $3.0 \times 10^{17}$ $cm^{-3}$ or less, which is not so high as to have negative impact on the light emitting characteristic.

In depositing a thin layer that typically has a thickness of 4.5 nm or less just like the conventional c-plane growing $In_xGa_{1-x}N$ (where $0<x<1$) well layer 104, if its growth rate is set to be 7 nm per minute or more, the controllability of the thickness will decrease. On the other hand, even if an m-plane growing $In_xGa_{1-x}N$ (where $0<x<1$) well layer 104 with a thickness of 6 nm or more and 17 nm or less is grown at a rate of 7 nm per minute or more, the controllability of the thickness does not decrease. That is why it can be said that to increase the growth rate of the GaN/InGaN multi-quantum well active layer 105 is a means applicable to the non-polar m-plane particularly effectively.

However, once the growth rate of the GaN/InGaN multi-quantum well active layer 105 exceeds 20 nm per minute, even if the $In_xGa_{1-x}N$ (where $0<x<1$) well layer 104 is deposited to 17 nm, which is the upper limit of exemplary thicknesses in the case of the m-plane growth, it takes less than one minute to get the crystal-growing process done. In general, the crystal-growing process is carried out with the substrate 101 mounted on a rotating susceptor so that source gases supplied can reach every corner on the surface of the substrate 101 uniformly by making the number of revolutions of the substrate 101 sufficiently high during the crystal-growing process time. That is why if the growing process time were extremely short, then the number of revolutions of the substrate 101 could not reach a sufficiently high level during the predetermined period of time. In that case, the source gases could not reach every single corner on the surface, thus causing a decrease in the in-plane uniformity. For that reason, the GaN/InGaN multi-quantum well active layer 105 preferably has a growth rate of 20 nm per minute or less.

After the GaN/InGaN multi-quantum well active layer 105 has been formed, the supply of the TMI gas is stopped and the hydrogen gas starts to be supplied again as a carrier gas, in addition to the nitrogen gas. Furthermore, the growing process temperature is raised to the range of 850° C. to 1000° C., and trimethylaluminum (TMA) and bis(cyclo-pentadienyl) magnesium ($Cp_2Mg$), which is a source gas of Mg as a p-type dopant, are supplied, thereby forming a p-AlGaN overflow suppressing layer 106. Next, the supply of the TMA gas is stopped to form a p-GaN layer 107.

Thereafter, the substrate is unloaded from the reaction chamber and only predetermined portions of the p-GaN layer 107 and GaN/InGaN multi-quantum well active layer 105 are removed by performing photolithography and etching processes, for example, thereby exposing a portion of the n-GaN layer 102. On the exposed region of the n-GaN layer 102, an n-electrode 108 consisting of Ti/Al layers is formed. On the other hand, on the p-GaN layer 107, a p-electrode 109 is formed. The p-electrode 109 may consist of Mg/Pt layers, Zn/Pt layers, Mg/Ag layers, Zn/Ag layers or Ni/Au layers.

By performing these process steps, the nitride-based light-emitting element of this embodiment can be fabricated. Optionally, after the element is completed, part or all of the crystal-growing substrate 101 may be removed. Also, part of the n-GaN layer 102 may be removed by polishing, for example.

According to this embodiment, by increasing the growth rate of the GaN/InGaN multi-quantum well active layer 105, the quantity of oxygen atoms to be introduced as an impurity into the GaN/InGaN multi-quantum well active layer 105 can be reduced. As a result, the number of non-radiative centers in the GaN/InGaN multi-quantum well active layer 105 can be reduced, and therefore, high emission efficiency can be achieved.

Particularly if the thickness of the $In_xGa_{1-x}N$ (where $0<x<1$) well layers 104 is set to be within the range of 6 nm or more and 17 nm or less, the volume of the carrier catchable region can be increased, and therefore, high emission efficiency can be achieved. When the c-plane growing process is carried out, the quantum confinement Stark effect will be produced and make it difficult to increase the thickness of the $In_xGa_{1-x}N$ (where $0<x<1$) well layers 104 to 6 nm or more. On the other hand, since the m-plane growing process is not affected by the quantum confinement Stark effect, the thickness of the $In_xGa_{1-x}N$ (where $0<x<1$) well layers 104 can be increased to 6 nm or more.

In the embodiment described above, the n-GaN layer 102, the GaN/InGaN multi-quantum well active layer 105, the AlGaN overflow suppressing layer 106 and the p-GaN layer 107 are supposed to be stacked in this order on the crystal-growing substrate 101. However, these layers do not always have to be stacked in this order. For example, the overflow suppressing layer 106 may be omitted. If no overflow suppressing layer 106 is provided, the n- and p-GaN layers 102 and 107 may be stacked in reverse order. In that case, the n- and p-electrodes 108 and 109 will also need to change positions with each other.

Optionally, according to this embodiment, an undoped GaN layer 208 such as the one shown in FIG. 9 may be provided between the GaN/InGaN multi-quantum well active layer 105 and the p-AlGaN overflow suppressing layer 106.

Patent Document No. 2 does disclose a technique for raising the emission efficiency of an element by increasing the growth rate of an active layer to emit light. However, Patent Document No. 2 is silent about how the quantities of oxygen and other impurities introduced unintentionally will affect the growth rate of the active layer. That is why Patent Document No. 2 does not suggest increasing the growth rate of the active layer in order to reduce the concentration of those impurities in the active layer.

Also, Patent Document No. 2 says that the thickness of the well layers that form the active layer is typically set to be 4.5 nm or less. If the growth rate were set to be too high in depositing that thin well layers, the growing process time would be very short. In that case, it would be difficult to reduce the variation in the thickness of the well layers so that each and every well layer has an intended thickness. Furthermore, the thicknesses of the well layers deposited will vary considerably from one position on the substrate plane to another, thus causing a significant decrease in the controllability of their thicknesses.

INDUSTRIAL APPLICABILITY

According to the present disclosure, the number of oxygen atoms to be introduced as an impurity into the active layer and to be non-radiative centers there can be reduced. Consequently, the present subject matter is applicable particularly effectively to light-emitting elements.

| REFERENCE SIGNS LIST | |
|---|---|
| 101, 201 | substrate |
| 102, 202 | n-GaN layer |
| 103, 203 | GaN barrier layer |
| 104, 204 | $In_xGa_{1-x}N$ (where $0 < x < 1$) well layer |
| 105, 205 | GaN/InGaN multi-quantum well active layer |
| 106, 206 | p-AlGaN overflow suppressing layer |
| 107, 207 | p-GaN layer |
| 108 | n-electrode |
| 109 | p-electrode |
| 208 | undoped GaN layer |

The invention claimed is:

1. A method for fabricating a semiconductor light-emitting element that includes an n-type gallium nitride-based compound semiconductor layer, a p-type gallium nitride-based compound semiconductor layer, and a light-emitting layer, which is interposed between the n- and p-type gallium nitride-based compound semiconductor layers, the method comprising the steps of:

(a) loading a substrate into a reaction chamber of a metalorganic chemical vapor deposition system; and (b) growing a (10-10) m-plane semiconductor layer, including an $In_xGa_{1-x}N$ (where $0 \leq x \leq 1$) well layer that has a thickness of 8 nm or more and 16 nm or less, as a light-emitting layer at a growth rate of not less than 7 nanometers/minute on the substrate by performing a metalorganic chemical vapor deposition process, wherein the step (b) includes setting the growth rate of the $In_xGa_{1-x}N$ (where $0<x<1$) well layer so that oxygen atoms included in the light-emitting layer have a concentration of $3.0 \times 10^{17}$ cm$^{-3}$ or less.

2. The method of claim 1, wherein the semiconductor light-emitting element further comprises an overflow suppressing layer, which includes Al, between the p-type gallium nitride-based compound semiconductor layer and the light-emitting layer.

3. The method of claim 1, wherein the growth rate is not more than 20 nanometers/minute.

4. The method of claim 1, wherein the concentration of the oxygen atoms is not less than $1.0 \times 10^{15}$ cm$^{-3}$.

5. The method of claim 3, wherein the concentration of the oxygen atoms is not less than $1.0 \times 10^{15}$ cm$^{-3}$.

* * * * *